United States Patent
Pedigo et al.

(10) Patent No.: US 6,312,621 B1
(45) Date of Patent: Nov. 6, 2001

(54) VIA FILL FORMULATIONS WHICH ARE ELECTRICALLY AND/OR THERMALLY CONDUCTIVE, OR NON-CONDUCTIVE

(75) Inventors: Jesse L. Pedigo, Chippewa Falls, WI (US); Nancy E. Iwamoto, Ramona, CA (US); Alan Grieve; Xiao-Qi Zhou, both of San Diego, CA (US)

(73) Assignee: Johnson Matthey Electronics, Inc., Spokane, WA (US)

( * ) Notice: Subject to any disclaimer, the term of this patent is extended or adjusted under 35 U.S.C. 154(b) by 0 days.

(21) Appl. No.: 09/439,249

(22) Filed: Nov. 12, 1999

Related U.S. Application Data

(60) Provisional application No. 60/108,815, filed on Nov. 17, 1998.

(51) Int. Cl.$^7$ .................................................. H01B 1/00
(52) U.S. Cl. ..................... 252/500; 252/502; 252/503; 252/511; 252/512; 252/519.2; 252/520.2; 525/122; 525/113; 525/434; 427/96; 427/97; 428/206; 428/210; 174/264; 174/256; 174/257; 174/263
(58) Field of Search ..................... 252/500, 502, 252/503, 511, 512, 514, 519.2, 519.3, 520.2; 525/122, 113, 434; 427/96, 97; 428/206, 210; 124/264, 256, 257, 263

(56) References Cited

U.S. PATENT DOCUMENTS

| | | | |
|---|---|---|---|
| 5,571,593 | * 11/1996 | Arldt et al. | 428/131 |
| 5,716,663 | * 2/1998 | Capote et al. | 427/96 |
| 5,906,042 | * 5/1999 | Lan et al. | 29/852 |
| 5,977,490 | * 12/1999 | Kawakita et al. | 174/265 |
| 6,057,402 | * 5/2000 | Zhou et al. | 525/122 |

FOREIGN PATENT DOCUMENTS

| | | | |
|---|---|---|---|
| 0708582A2 | 4/1996 | (EP) | H05K/3/32 |
| WO95/13901 | 5/1995 | (WO) | B23K/35/34 |

OTHER PUBLICATIONS

Gallagher et al., "Vertical Interconnect in Multilayer Applications Using Ormet® Conductive Composites", 1997 International Symposium on Advanced Packaging Materials, pp. 35–37.

* cited by examiner

*Primary Examiner*—Yogendra Gupta
*Assistant Examiner*—Derrick G. Hamlin
(74) *Attorney, Agent, or Firm*—Robert D. Fish; Fish & Associates, LLP

(57) ABSTRACT

A via fill formulation including electrically and/or thermally conductive particulate filler, or non-conductive, electrically conductive polymer and a resin vehicle.

16 Claims, No Drawings

VIA FILL FORMULATIONS WHICH ARE ELECTRICALLY AND/OR THERMALLY CONDUCTIVE, OR NON-CONDUCTIVE

This application benefit of a provisional application Ser. No. 60/108,815 filed Nov. 17, 1998.

BACKGROUND OF THE INVENTION

The invention relates to formulations suitable for use as a via fill. Vertical interconnects are discussed in an article of March 9–12, 1997 in Braselton, Ga. by D. Pommer et al., entitled "Vertical Interconnect in Multilayer Applications Using Ormet® Conductive Composites"; and electrically conductive pastes are discussed in EP0708582A1; the disclosures of both are expressly incorporated herein by reference.

SUMMARY OF THE INVENTION

Formulations suitable for use as via fill may be formulated by combining electrically and/or thermally conductive particulate filler, an electrically and thermally conductive polymer, bleed- suppressing agents and a resin system vehicle for electrically and/or thermally conductive versions. Alternatively to a conductive filler, a non-conductive filler may be used for a non-conductive version.

In accordance with one embodiment of the invention the formulation involves a conductive highly moisture resistant cycloaliphatic epoxy/cyanate ester formulation such as may be suitable for use as a via fill for circuit boards and laminate substrates. Advantageously, the via fill formulation may comprise a resin mixture of two cycloaliphatic epoxies, cyanate ester, and epoxidized polybutadiene and a lewis acid catalyst such as a zirconate, titanate, tin, vanadium, zinc, boron or aluminum-based catalyst, as well as electrically and/or thermally conductive particulate filler, including conductive polymers. Conductive polymer may be included to enhance thermal and electrical conductivity and control Theological properties and surface energy properties. Cycloaliphatic epoxies and polybutadiene are useful to adjust the flexibility of the cured system to match the properties to organic-based laminate structures with which the formulation may be used. Additional flexibility may be obtained through use of other long chain polymers such as siloxanes, acrylates, long chain epoxies, urethanes, etc.

The via fill formulations are capable of being adjusted for increased pot life stability and enhanced rheology during via printing, low voiding, high adhesion to copper and high moisture resistance after curing. Pastes formulated from these materials may show enhanced stability under Level 1 Jedec preconditioning.

DETAILED DESCRIPTION

The formulations of the invention can be produced in a form of high viscosity, screen printable, electrically and/or thermally conductive paste with high moisture resistance and high flexibility for compliance matching when introduced into or on an organic laminate surface. In the preferred embodiments in Tables 1, 5 & 6 below, the binder in the formulation comprises a mixture of cycloaliphatic epoxies, cyanate ester and an elastomer (typically a partially hydrolyzed, epoxidized polybutadiene lewis acid catalyst such as a zirconate, titanate, tin, vanadium, zinc, boron or aluminum-based catalyst). The zirconate is selected for stability and low void purposes. The formulation may be usefully further adjusted by including Theological, conductivity and bleed control agents by introduction of a conductive polymer filler such as polyanilines, polypyrroles, or polypyrrole coated carbon, polythiophenes, polyacetylenes, polyphenylenvinylenes, polythienylenevinylenes, polyphenylenes, polyphenylsulfides, and polyfurnayls-based polymers. A bleed modifier may also be included to control viscosity and bleed, and is useful in enhancing conductivity in conjunction with use of the conductive polymer. In another embodiment additional additives such as Disorbene LC (dibenzylidene sorbitol) which can used to control rheology, may be included. The filler, e.g. silver flake, copper powder, silica, silicon carbide, etc. may be usefully prepared with a specific particle size distribution to provide maximum conductivity for this resin system. In addition, for example, specific silver flake coating may be used to help both physical and chemical stability of the paste during its useful life.

The present invention provides thick, formulation pastes whose viscosity is formulated to be suitable for screen printing and advanced printing processes such as vacuum assisted printing and pressure assisted printing, into fine geometry holes for the printed wiring board and microelectronic substrate industries. The paste must be stable over process life, which means no settling, bleed, excessive viscosity changes or changes in tack and rheology, and no phase separation during processing either in the dispense process or after printing while sitting in the via-holes and during cure. The paste formulations may be used for any type of via-hole, blind or through-hole. The paste is also formulated to withstand all previously mentioned printing processes into via holes of any aspect ratio making it versatile for both substrate and board articles. The via fill has been formulated to be moisture stable in order to withstand plating bath conditions and environmental pre-conditioning, after curing, and to adhere to both laminate and copper surfaces present in the via-hole during these processes. In addition, the compliancy of the via fill has been adjusted to be compatible with the organic construction of the printed wiring board or laminate substrate in order to avoid post-processing or work-life failure of the via fill.

Other embodiments include the use of a specific particle distribution and as mentioned before, the use of a conductive polymer. The particle distribution advantageously provides for high packing for the conductive version which helps achieve conductivity. The conductive polymer filler has a multitude of functions: it controls rheology for the screen printing process, controls settling and phase separation for shelf-life and process stability, helps to control bleeding during printing and thermal processing, and it enhances both electrical and thermal conductivity. Because the conductive polymer functions in controlling Theological properties, the final formulation in either of the electrically and/or thermally or non-conductive versions show enhanced printing stability in either standard processes or in newer vacuum or pressure assisted processes. That is, there is no phase separation or settling during printing or in the via holes.

For reference herein, the following trade designations relate to the chemical compositions indicated:

L-10 =Arocy L-10, or I, 1 bis[4-cyanatophenyl] ethane
Armak 136 =a proprietary quaternary amine from Akzo Chemicals
Ancamine =a proprietary polyamine from Air Products & Chemicals, Inc.
TMPTA —trimethylolpropane triacrylate
TEGDA =tetraethyleneglycol diacrylate
AIBN =2,2-azobisisobutyronitrile ERL 4299 =bis [3,4 epoxy-cyclohexylmethyl adipate] from Union Carbide ERL 4221=3,4 epoxy-cyclohexylmethyl, 3,4-carboxylate, from Union Carbide Disorbene LC =dibenzylidene sorbitol from Roquette Corp.

Thermally conductive fillers include but are not limited to: silicon carbide, silicon nitride, aluminum nitride, boron nitride and diamond dust, silica coated aluminum nitride, silica coated boron nitride and silica coated silicon nitride. Graphite may be also used in addition to common metals such as silver, copper and gold if both electrical and thermal conductivity are required.

Specific Component Performance Characteristics of Preferred Embodiments:

ERL 4299 =bis [3,4 epoxy-cyclohexylmethyl, adipate] a cycloaliphatic epoxy used to impart toughness into the formulation as well as some moisture resistance.

ERL 4221=3,4, epoxy-cyclohexylmethyl, 3,4-carboxylate; used to impart toughness into the formulation as well as some moisture resistance.

NZ01 =Neopentyl (diallyl) oxy trineodecanoyl zirconate used as a zirconium-based catalyst for the L-10 co-reaction with any epoxy component.

Hydroxy functionalized epoxidized polybutadiene: Used to impart flexibility and toughness into the formulation, as well as imparting moisture resistance.

L-10 (1,1 bis [4-cyanatophenyl] ethane) reaction product with ERL 4299 (bis [3,4 epoxy-cyclohexylmethyl adipate]), ERL 4221 (3,4 epoxy-cyclohexylmethyl, 3,4-carboxylate) and hydroxy functionalized epoxidized polybutadiene: the reaction products help to impart moisture resistance, increases adhesion strength.

Copper: used for conductivity, and for platability of holes.

Disorbene LC: reactive modifier/co-catalyst

Alpha methyl cinnamaldehyde: controls bleed characteristics, also helps to enhance conductivity when used in conjunction with the conductive polymer.

Conductive polymer does many things:
1. Controls printing rheology any filler
2. Controls settling with any filler
3. Controls phase separation with any filler
4. Enhances thermal conductivity in conjunction with thermally conductive fillers such as silicon carbide, silicon nitride, aluminum nitride, boron nitride and diamond dust
5. Enhances electrical conductivity in conjunction with electrically conductive fillers.

In the preferred embodiments, the formulation is made using a simple convention: the vehicle is prepared separately, with the filler and additives added according to application (electrically and/or thermally conductive or non-conductive).

The vehicle may be prepared as follows: The two cycloaliphatic resins are blended together and degassed. The cyanate ester and polybutadiene resins are blended together and degassed. Both new blends are combined, the catalyst is added, and then the dibenzylidene sorbitol is added. The entire mixture is degassed.

The final formulation maybe prepared as follows: The alpha methyl cinnamaldeyde is mixed into the vehicle, the conductive polymer is fully mixed and wetted into the mixture, and finally the filler(s) is added and fully wetted and blended in using either planetary mixing, 3-roll milling or mortar/grinding methods. The mixture is blended and degassed before storing at −40° C. until use.

Modifications to the procedure may be made but the general procedure of preparing the basic vehicle first, then adding the modifiers (such as the bleed modifier and the conductive polymer) and finally the fillers to create the final formulation, is preferred.

In use, standard printing techniques have been tested to fill via-holes. In addition, both vacuum-assisted and pressure-assisted filling techniques have been demonstrated with good hole fill on any available aspect ratio (e.g. greater than 20 to one, and extrapolated at greater than 25 to one aspect ratio), with a demonstrated absence of settling, phase separation, wall delamination, voiding, slumping, doming or other anomalies found in other via fill preparations. After filling the holes the part is cured at 150°–175° C. for 30–120 min.

The following examples will serve to illustrate formulations in accordance with the invention.

TABLE 1

Conductive Via Fill Formulation Example

Preferred Embodiment

| VEHICLE: Component | % Range |
|---|---|
| ERL 4299 = (bis[3,4 epoxy-cyclohexylmethyl adipate] | 10–20 |
| ERL 4221E = 3,4 epoxy-cyclohexylmethyl, 3,4-carboxylate | 20–40 |
| L-10 = 1,1 bis [4-cyanatophenyl] ethane | 35–50 |
| Epoxidized polybutadiene | 5–20 |
| Zirconium pentanedionate | 0.3–0.6 |
| Disorbene LC = dibenzylidene sorbitol | 0.1–0.4 |
| VIA FILL: | |
| Silver flake | 60–80 |
| Copper powder | 10–20 |
| Alpha methyl cinnamaldehyde | 0–3 |
| Polypyrrole-based conductive polymer | 0.1–2 |
| Vehicle (above | 10–20 |

NOTE:
Conductive polymer may be used as an individual component (such as use of Eeonomer series from Eeonyx Corp., Pinole, California), or as a coating on a filler such as silver, copper, silicon carbide, silica, diamond, gold, aluminum, zinc, tin, alumina, aluminum nitride, silicon nitride and boron nitride.

Silver distribution specifications:

| % Range | Microns |
|---|---|
| 100 | 25–44 |
| 90 | 9–15 |
| 50 | 4–10 |
| 10 | 1–4 |

No particles below 1 micron
Uniform monomodal distribution, no hint of bimodal
Tap density: 3–5 g/cm$^3$
Surface Area: 0.12–2.5 m$^2$/g
TGA: 0.7–0.4

COPPER DISTRIBUTION SPECIFICATIONS:

| % Range | Microns |
|---|---|
| 100 | 55 MAX |
| 90 | 20–27 |
| 50 | 13–15 |
| 20 | 7–10 |
| 10 | 6–10 |
| 400 mesh copper powder | |

TABLE 2

Paster Characteristics

| | |
|---|---|
| Viscosity Range: | 60–160 Kcps @ 10 RPM |
| Contact Resistance: | 0.001–0.0005 ohm-cm |
| Average Adhesion to Copper: | >10.5 kg as cured |
| Preconditioned Adhesion Results: | % Retention from As-Cured State |
| HAST | 73–80 |
| 1000 hrs TC level 1 | 73–80 |
| Boiling water 2 hrs | 70–83 |
| Weight Gain: | |
| Condition: | % |
| Boiling water 2 hrs | 0.11 (cured at 175° C./30 min) |
| | 0.05 (cured at 150° C./60 min) |
| 85C/85% RH | 0.93 (cured at 175° C./30 min) |
| | 0.78 (cured at 150° C./60 min) |
| DSC: (30–300° C., 10 deg/min) | |
| Onset <40° C. | |
| Peak 133° C. | |
| Tg: | |
| DMA 70.3° C. | 150° C./1 hr |
| DSC: 89.71/91.75° C. | 160° C./1 hr |

It is also possible in accordance with the invention to prepare the formulation in the form of a thermally conductive material. The following examples illustrate this embodiment of the invention. The compositions discussed include the following materials, available from the indicated sources.

L-10=cyanate ester from Ciba Geigy, Brewster, N.Y.; Armak 1363=a proprietary quaternary ammonium surfactant from Akzo Chemicals (Chicago, Illinois); Ancamine= proprietary polyamine from Air Products & Chemicals, Allentown, Pennsylvania; CP=conductive polymer (note: all conductive polymers obtained from Eeonyx, Pinole, California and have a carbon core structure); SiC=silicon carbide, 325 mesh, available from Spectrum Chemical Mfg. Corp., Gardena, Calif.

Using the material discussed above the following examples were prepared to illustrate thermally conductive formulations of the invention.

TABLE 3a

Vehicle for a thermally conductive paste

| | IL-10 | Armak 1363 | Ancamine | TMPTA | TEGDA | AIBN | nonylphenol | Silica |
|---|---|---|---|---|---|---|---|---|
| (%) | 51.81 | 0.80 | 13.65 | 14.06 | 14.06 | 0.80 | 4.02 | 0.80 |

TABLE 3b

Formulation with Vehicle in Table 3a and Results

| ID | | Ag flake | Vehicle | SiC | CP | Contact Resistance (ohm-cm2) | Thermal Conductivity (W/m-K) |
|---|---|---|---|---|---|---|---|
| 1a | % | 75.075 | 25 | | | >20 | 0.88 |
| 1b | % | 71.321 | 25 | 3.75 | | 9.261 | 1.097 |
| 1c | % | 74.324 | 25 | 0.75 | | 1.161 | 1.127 |
| 1d | % | 70.571 | 20 | 3.75 | 0.75 | 0.0402 | 1.372 |
| 1e | % | 0 | 35.15 | 64.85 | | | 0.989 |
| 1f | % | 0 | 35.15 | 64.201 | 0.64 | | 0.998 |

TABLE 4

Simple Example and Experimental Results

| | | ERL 4299* | SiC | CP | Thermal Conductivity |
|---|---|---|---|---|---|
| 3a | % | 35 | 65 | 0 | >1.895 W/mK (laser flash method) |
| 3b | % | 35 | 64 | 1 | >1.1929 (laser flash method) |

Simple formulation with low moisture epoxy only (ERL 4299): ERL 4299 is a cycloaliphatic epoxy from Union Carbide, Danbury, Connecticut.
*bis [3,4 epoxy-cyclohexylmethyl adipate.

TABLE 5a

Vehicle
Formulation with cyanate ester/cycloaliphatic epoxy system. Preferred embodiment of thermally conductive version

| | % Ranges |
|---|---|
| Bis 3,4 epoxy-cyclohexylmethyl adipate | 10–20 |
| 3,4 epoxy cyclohexylmethyl -3,4 carboxylate | 20–40 |
| 1,1 bis[4-cyanatophenyl] ethane | 35–50 |
| epoxidized polybutadiene | 6–18 |
| zirconium catalyst, NZ01 | 0.3–0.6 |
| dibenzylidene sorbitol | 0.1–0.4 |

TABLE 5b

Via Fill

| | % Ranges |
|---|---|
| SiC | 60–80 |
| alpha methyl cinnamaldehyde | 0–3 |
| CP | 0.1–3 |
| vehicle in table 5a | 14–40 |

NOTE: expected thermal conductivity ~1.5–2.0 W/m-K)

In the preferred embodiments (Tables 1, 5, 6) the compositions additionally include the following materials:

Bis 3,4 epoxy cyclohexylmethyl adipate and 3,4 epoxy cyclohexylmethyl- 3,4 carboxylate are cycloaliphatic epoxies from Union Carbide, Danbury, Connecticut.

1,1 bis [cyanatophenyl] ethane is a cyanate ester from Ciba-Geigy, Brewster, N.Y.

Epoxidized polybutadiene, and alpha methyl cinnamaldehyde are standard chemicals ordered through Aldrich Chemicals, Milwaukee, Wis.

Disorbene LC or dibenzylidene sorbitol is ordered through Roquette Corp., Gurnee, Ill.

Neopentyl (diallyl) oxy, trineodecanoyl zirconate or NZ01 is available through Kenrich Petrochemicals of Bayonne, N.J.

TABLE 6a

Vehicle
Non-conductive (no thermal or electrical conductivity paste form, preferred embodiment:

| | % Ranges |
|---|---|
| ERL 4299 (bis 3,4 epoxy cyclohexyl methyl adipate) | 10–20 |
| ERL 4221E (3,4 epoxy cyclohexyl methyl 3,4) carboxylate | 20–40 |
| L-10 1,1 (bis [4-cyanatophenyl] ethane) | 35–50 |
| epoxidized polybutadiene | 6–18 |
| zirconium catalyst, NZ01 | 0.3–0.6 |
| Disorbene LC | 0.1–0.4 |

TABLE 6b

Via Fill

| | % Ranges |
|---|---|
| silica | 50–80 |
| alpha methyl cinnamaldehyde | 0.3 |
| cP | 0.1–3 |
| vehicle in Table 6a | 14–40 |

In addition, a non-conductive version may be created with the same superior processing and performance characteristics as the electrically and/or thermally conductive versions through use of a conductive polymer in conjunction with a non-conductive filler such as silica and alumina. The conductive polymer was found to control rheology, settling, phase separation and bleed properties. Because it is present in such small quantities and because it has a low intrinsic conductivity compared to metals, when used with a non-conductive filler, it does not influence the conductivity of the non-conductive version. An example of a non-conductive version is given in Table 6a and 6b.

Performance of via fill formulations described above have been tested for thermal and electrical conductivity. With silver filler the contact resistance is from 0.0009 to 0.004 ohm-cm. A thermal conductivity of 1.393 W/m-K (bulk conductivity method) and 1.496 W/m-K (laser-flash method) was determined.

The formulation of the invention reflects the need for high moisture insensitive, electrically and thermally conductive paste useful for via fill. The formulation is improved for voiding and printing work life and has been found to have superior printability and adhesion as compared to standard material normally used for these purposes.

What is claimed is:

1. A material suitable for use as a via fill comprising at least one of an electrically conductive particulate filler, thermally conductive particulate filler or non-conductive filler, an electrically conductive polymer, bleed-suppressing agent and a resin vehicle, wherein said resin vehicle comprises: 10 to 20% bis 3.4 epoxy-cyclohexyl methyl adipate, about 20–40% 3.4 epoxy cyclohexylmethyl 3,4 carboxylate, about 35–50% 1,1bis 4-cyanatophenyl ethane, about 5 to 20% epoxidized polybutadiene, about 0.3 to 0.6% titanium-based Lewis acid catalyst, about 0.3 to 0.6% zirconate-based Lewis acid catalyst, and about 0.1 to 0.4% dibenzylidene sorbitol.

2. A material according to claim 1, selected from the group consisting of at least one of a silver particulate filler a copper particulate filler, an electrically conductive polymer or a thermally conductive polymer.

3. A material according to claim 1 comprising at least one thermally conductive filler selected from the group consisting of silicon carbide, aluminum nitride, silver coated boron nitride, diamond, silica coated aluminum nitride and silica coated silicon nitride.

4. A material according to claim 1, comprising an electrically; thermally conductive filler selected from the group consisting of silver, copper, graphite, gold, aluminum, nickel, zinc, tin flakes or powders.

5. A material according to claim 1 comprising a non-conductive filler selected from the group consisting of silica, alumina, silicon carbide, diamond, aluminum nitride, silicon nitride, boron nitride, silica coated aluminum nitride, silica coated boron nitride or silica coated silicon nitride.

6. A formulation suitable for use in via fill comprising a vehicle and a filler material wherein the vehicle about 10 to 20% bis 3,4 epoxy-cyclohexyl methyl adipate, about 20-40% 3,4 epoxy cyclohexylmethyl 3,4 carboxylate, about 35 to 50% 1,1 bisethane, about 5 to 20 % epoxidized polybutadiene, about 0.3 to 0.6 % neopentyl (diallyl) oxy, trineodecanoyl zirconate, and about 0.1 to 0.4% dibenzylidene sorbitol.

7. A formulation according to claim 5 wherein the via fill material comprises about 60 to 95% silver flake, about 10 to 25% copper powder, about 0 to 3% alpha methyl cinnamaldehyde, about 0.1 to 3% of an electrically conductive polymer comprising polypyrroles, polyanilines, polypyrrole coated carbon, polythiopbhenes, polyacetylenes, polyphenylenvinylenes, polythienylenevinylenes, polyphenylenes, polyphenylsulfides, polyfurnayls-based polymers.

8. A formulation according to claim 6 having about 10 to 20% of said vehicle.

9. A formulation according to claim 6 wherein said electrically conductive polymer comprises an individual component selected from the group consisting of Eeonomer series, a precipitated powder of a conductive polymer or as a coating on a filler such as silver, copper, silicon carbide, silica, diamond, gold, aluminum, zinc, tin, alumina, aluminum nitride, silicon nitride and boron nitride.

10. A formulation according to claim 4 having particulate silver in the following particle size distribution range: Silver distribution specifications:

| % Range | Microns |
|---|---|
| 100 | 25–44 |
| 90 | 9–15 |
| 50 | 4–10 |
| 10 | 1–4 |

No particles below 1 micron
Uniform monomodal distribution, no hint of bimodal
Tap Density: 3–5 g/cm$^3$
Surface Area: 0.12–2.5 m$^2$/g
TGA: 0.7–0.4

11. A formulation according to claim 4 having particulate copper in the following particle size distribution range:

| % Range | Microns |
|---|---|
| 100 | 55 max |
| 90 | 20–27 |
| 50 | 13–15 |
| 20 | 7–10 |
| 10 | 6–10. |

12. A formulation of claim 4 in the form of a paste having the following properties:

| | |
|---|---|
| Viscosity Range: | 60–160K cps @ 10 RPM |
| Contact Resistance: | 0.001–0.0005 ohm-cm |
| Average Adhesion to Copper: | 10.5 kg as cured |
| Preconditioned Adhesion Results: | % Retention from As-Cured State |
| HAST | 73–80 |
| 1000 hrs TC level 1 | 73–80 |
| Boiling water 2 hrs | 70–83 |
| Weight Gain: | |
| Condition: | % |
| Boiling water 2 hrs | 0.11 (cured at 175° C./30 min) |
| | 0.05 (cured at 150° C./60 min) |
| 85C/85% RH | 0.93 (cured at 175° C./30 min) |
| | 0.78 (cured at 150° C./60 min) |
| DSC: (30–300° C., 10 deg/min) | |
| Onset | >40° C. |
| Peak | 133° C. |
| Tg: | |
| DMA 70.3° C. | 150° C./1 hr |
| DSC: 89.71/91.75° C. | 160° C./1 hr. |

13. A formulation suitable for use as a via fill comprising a vehicle and a filler material wherein the vehicle comprising about 10 to 20% bis 3,4 epoxy-cyclohexylmethyl adipate, about 20 to 40% 15 3,4 epoxy cyclohexylmethyl 3,4 carboxylate, about 35 to 50% 1,1 bisethane, about 5 to 20% epoxidized polybutadiene, about 0.3 to 0.6% neopentyl (diallyl) oxy trineodecanoyl zirconate, and about 0.1 to 0.4% dibenzylidene sorbitol.

14. A formulation according to claim 11 wherein the via fill material comprises about 50 to 95%, silicon carbide, silica, alumina, silicon carbide, diamond, aluminum nitride, silicon nitride, boron nitride, silica coated aluminum nitride, silica 25 coated boron nitride or silica coated silicon nitride, about 0.1 to 3% CP, 3% conductive polymer selected from the group consisting of polypyrroles, polyanilines, polypyrrole coated carbon, polythiophenes, polyacetylenes, polyphenylenvinylenes, polythienylenevinylenes, polyphenylenes, polyphenylsulfides, polyfurnayls-based polymers 30 and 0 to about 3% alpha methyl cinnamaldehyde.

15. A formulation according to claim 12 having about 10 to 50% of said vehicle.

16. A formulation according to claim 12 wherein said electrically conductive polymer comprises an individual components such as Eeonomer series or a precipitated powder of a pure conductive polymer, or as a coating on a filler selecting from the group consisting of silver, copper, silicon carbide, silica, diamond, gold, aluminum, zinc, tin, alumina, aluminum nitride, silicon nitride and boron nitride.

* * * * *